(12) United States Patent
Hshieh

(10) Patent No.: US 7,612,407 B2
(45) Date of Patent: Nov. 3, 2009

(54) TRENCHED MOSFET DEVICE CONFIGURATION WITH REDUCED MASK PROCESSES

(75) Inventor: Fwu-Juan Hshieh, Saratoga, CA (US)

(73) Assignee: Force-MOS Technology Corp. Ltd, Grand Cayman (KY)

( * ) Notice: Subject to any disclaimer, the term of this patent is extended or adjusted under 35 U.S.C. 154(b) by 252 days.

(21) Appl. No.: 11/519,754

(22) Filed: Sep. 11, 2006

(65) Prior Publication Data

US 2008/0121986 A1    May 29, 2008

Related U.S. Application Data

(60) Provisional application No. 60/835,992, filed on Aug. 7, 2006.

(51) Int. Cl.
*H01L 27/108* (2006.01)
(52) U.S. Cl. .............................. 257/330; 257/E29.257
(58) Field of Classification Search ............... 257/328, 257/330, 333, E29.262, E21.41, E29.146, 257/E29.257
See application file for complete search history.

(56) References Cited

U.S. PATENT DOCUMENTS 6,833,583 B2 * 12/2004 In't Zandt et al. ........... 257/329

* cited by examiner

*Primary Examiner*—Minh-Loan T Tran
*Assistant Examiner*—Selim Ahmed
(74) *Attorney, Agent, or Firm*—Bo-In Lin

(57) ABSTRACT

A semiconductor power device comprising a termination area that includes a trenched gate runner electrically connected to a trenched gate of said semiconductor power device. The semiconductor power device further includes a trenched field plate disposed in a trench opened in the termination area and the trenched field plate is electrically connected to the trenched gate runner. A gate runner contact trench and a field plate contact trench opened through an insulation layer covering the gate runner and the trenched field plate for extending into a doped gate dielectric filling in the trenched gate runner and the field plate wherein the gate runner contact trench and the field plate contact trench filled with a gate runner contact plug and a field plate contact plug respectively. A gate metal disposed on top of the insulation layer to electrically contact the gate runner contact plug and the field plate contact plug for electrically interconnecting the trenched gate runner and the trenched field plate.

13 Claims, 11 Drawing Sheets

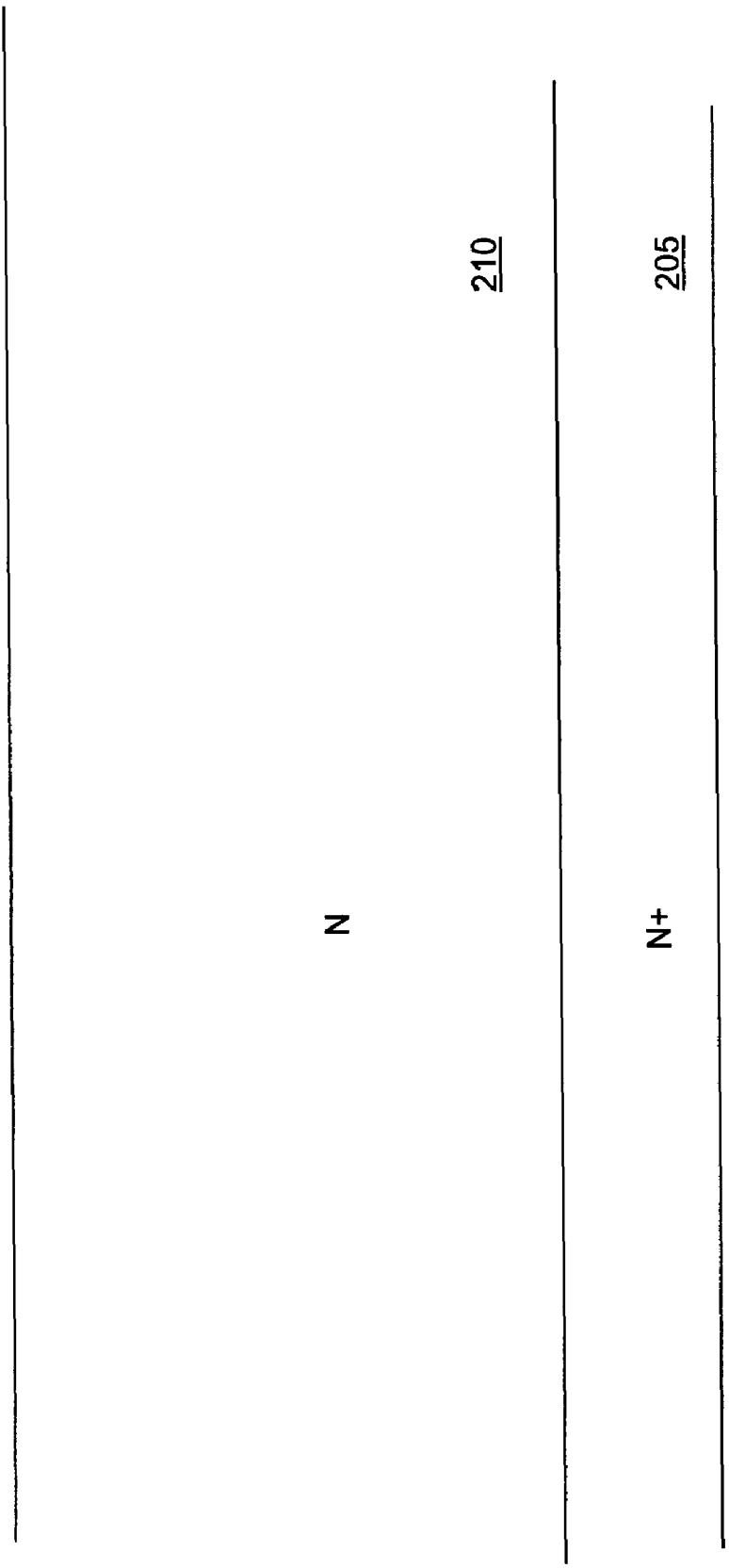

TRENCHED MOSFET DEVICE CONFIGURATION WITH REDUCED MASK PROCESSES

BACKGROUND OF THE INVENTION

This Formal Application claims a Priority Date of Aug. 7, 2006 benefited from a Provisional Patent Applications 60/835,992 filed by the same Applicant of this Application.

FIELD OF THE INVENTION

This invention relates generally to the cell structure, device configuration and fabrication process of power semiconductor devices. More particularly, this invention relates to a novel manufacturing processes with reduced masks by implementing improved termination configuration with gate runner of reduced width and improved trenched gate runner contact formed with tungsten plugs wherein the termination areas may be further reduced.

DESCRIPTION OF THE RELATED ART

Conventional technologies for manufacturing semiconductor power devices are continuously challenged to further reduce the manufacturing cost by reducing the number of masks applied in the manufacturing processes. Furthermore, in attempt to miniaturize the device, the technologies are still faced with a limitation that prevents further increase of the cell density on a limited wafer surface area. Particularly, the limitation is due to the areas on the wafer that are occupied by an extension of gate runners from the active cell area to the termination area. Specifically, the conventional semiconductor power devices generally place a gate runner in the termination area by providing a wide trench. The greater width of the gate runner trench is required to allow gate metal contact directly to gate poly in the trench without causing gate and source shortage. A wider gate-runner trench in the termination area introduces another manufacturing difficulty due to a process requirement that a thicker polysilicon layer is applied to fill in the wider gate runner trench. Moreover, a thicker layer of polysilicon layer requires more elaborated and time consuming processes of processing chemical and mechanical planarization (CMP) or a longer dry polysilicon etch to obtain a more even-leveled and smooth planar top surface for better metal step coverage. The conventional termination configuration of the semiconductor power devices thus leads to more costly and time consuming manufacturing processes due to the wider gate-runner trenches as that commonly implemented in a metal oxide semiconductor field effect transistor (MOSFET).

In U.S. Pat. Nos. 6,396,090 and 6,309,929, a termination structure for power trench MOS devices that includes a trench polysilicon field plate is disclosed. The termination structure includes a semiconductor substrate having a trench formed therein; a spacer-like MOS gate formed on a sidewall of the trench; a termination structure oxide layer formed in the trench to cover a portion of the spacer-like MOS gate and to cover a bottom of the trench; and a first electrode and a second electrode are, respectively, formed on a bottom surface and upper surface of the semiconductor substrate. The trench is formed from a boundary of the active region to an edge of the semiconductor substrate. The trench MOS devices are formed in the active region. This invention provides an advantage of eliminating the requirement of applying a body mask. However, the MOS device as disclosed has the disadvantages that the source metal connecting to the polysilicon field plate requires a separate gate runner metal and therefore occupies more space. Also, the p-regions are formed before a trench etching process. The process causes the boron to segregate along the trench sidewall during the sacrificial oxidation process and leads to an undesirable punch through vulnerabilities. The process further prevents further saving of a N+ source mask without having N+ source in termination.

Another termination structure of a trench DMOS device is disclosed in U.S. Pat. No. 6,855,986 to reduce occurrence of current leakage resulting from electric field crowding at the border of the active area. The termination structure for the trench DMOS device includes a trench extends through the body region between an active area and an edge of the substrate. A gate oxide layer lines the trench and extends to the upper surface of the body region between the trench and the active area. A passivation layer is formed on the gate oxide layer, including sidewalls and a bottom surface of the trench. A metal layer covers portions of the passivation layer on the sidewalls of the trench to expose a part of the passivation layer over the bottom surface of the trench. The device and the manufacturing processes provide an advantage of saving a p-body mask using a trench metal field plate structure. However, the polysilicon sidewall spacer along deep trench is difficult to remove by applying a dry etching. It causes a particular manufacturing issue thus requiring special attention in carrying out this process. Also, the single metal contact causes poor metal step coverage that limits cell pitch shrinkage. The P-body is formed before etching the trench thus resulting in boron segregation along trench sidewall during sacrificial oxidation causes punch-through issue, which is more pronounced for higher cell density. Furthermore, the device configuration prevents further elimination of the requirement of using a source mask without having N+ source in termination. Additionally, the source metal that connects to the polysilicon field plate requires separate gate runner metal thus occupying additional space.

Therefore, there is still a need in the art of the semiconductor device fabrication, particularly for trenched power MOSFET design and fabrication, particularly in the termination area, to provide a novel cell structure, device configuration and fabrication process that would resolve these difficulties and design limitations. Specifically, it is desirable to maintain good electric contact to the trenched gate runner, to reduce the space occupied by the gate runner and the field plate. Furthermore, it is very desirable to further reduce the number of masks employed to manufacture the semiconductor power devices such that the above discussed difficulties and limitations may be resolved.

SUMMARY OF THE PRESENT INVENTION

It is therefore an aspect of the present invention to provide new and improved semiconductor power device configuration with reduced areas occupied by the field plate and the gate runner metal by merging a trenched field plate with the gate runner metal. Alternatively, the number of cells in same die size can be further increased in a semiconductor power device. Another aspect of this invention is the new and improved termination configuration is able to achieve lower Rds because the spaces that previously occupied by separate gate runner metal and field plate metal are now merged. The lower Rds is achieved when the new and improved configuration now eliminates these separate gate runner and field plate metals previously required in the conventional semiconductor power devices.

It is another aspect of this invention to further simplify the manufacturing processes by saving both the body mask and the source mask. The further simplified manufacture processes thus achieve product cost savings and further improve the production yield, the device reliability and performance.

It is another aspect of this invention that the electrical contacts to the source; the gate; the gate runner and the equal potential ring are all implemented with a tungsten contact plug disposed in the contact trenches. The electrical contacts are further improved with the contact plug directly contact those regions by extending into the source-body regions, the gate polysilicon, and the body doped region under the EPR, thus reliable and high performance electrical contacts are provided.

It is another aspect of this invention that the die size of the semiconductor power device can be further reduced with shortened termination area because the trenched gate runners in the termination area have shorter length. Furthermore, the termination areas are reduced with the merged gate runner metal and the field plate metal for the trenched field plate. The termination area can be reduced with a length less than ten micrometers.

Briefly, in a preferred embodiment, the present invention discloses a semiconductor power device includes a termination area including a trenched gate runner electrically connected to a trenched gate of said semiconductor power device. The semiconductor power device further includes a trenched field plate disposed in a trench opened in the termination area and the trenched field plate is electrically connected to the trenched gate runner. In a preferred embodiment, the semiconductor power device further includes a gate runner contact trench and a field plate contact trench opened through an insulation layer covering the gate runner and the trenched field plate for extending into a doped gate dielectric filling in the trenched gate runner and the field plate wherein the gate runner contact trench and the field plate contact trench filled with a gate runner contact plug and a field plate contact plug respectively. In another preferred embodiment, the semiconductor power device further includes a gate metal disposed on top of the insulation layer to electrically contact the gate runner contact plug and the field plate contact plug to electrically interconnect the trenched gate runner and the trenched field plate. In another preferred embodiment, the semiconductor power device further includes a equal potential ring (EPR) disposed in the termination area wherein the EPR electrically connecting to a body dopant region and a doped dielectric EPR material disposed in a trench. In another preferred embodiment, the semiconductor power device further includes a body-dopant region contact trench and an equal potential contact trench opened through an insulation layer covering a top surface above the body-dopant region the doped dielectric EPR material for extending into the body-dopant region and the doped dielectric EPR material wherein the body-dopant region contact trench and the EPR contact trench filled with a body-dopant region contact plug and an EPR contact plug respectively for electrically contacting and interconnected through the EPR. In another preferred embodiment, the body-dopant region contact plug and the EPR contact plug further includes a tungsten contact plug. In another preferred embodiment, the sem body-dopant region contact plug and the EPR contact plug further includes a tungsten contact plug surrounded by a Ti/TiN barrier layer. In another preferred embodiment, the semiconductor power device further includes a gate metal disposed on top of the insulation layer to electrically contact the gate runner contact plug and the field plate contact plug for electrically interconnecting the trenched gate runner and the trenched field plate and wherein the gate metal has a width substantially between two to six micrometers In another preferred embodiment, the trenched field plate and the trenched gate runner are electrically connected by a shortened interconnection whereby the termination area has a length between five to ten micrometers. In another preferred embodiment, the trenched field plate is formed as a polysilicon sidewall spacer in a trench for electrically connecting to the trenched gate runner.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3A to 3H are a serial of side cross sectional views for showing the processing steps for fabricating a MOSFET device as shown in FIGS. 2A to 2B.

DETAILED DESCRIPTION OF THE PREFERRED EMBODIMENT

Figure 1A:
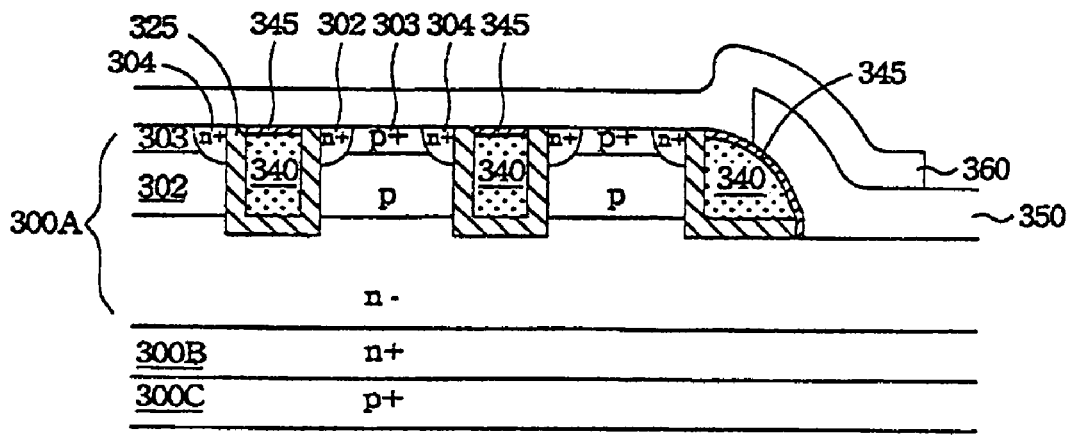
FIGS. 1A and 1B are two side cross sectional views of two conventional MOSFET devices for achieving saving body mask but having wide space between the active and the termination area.
Figure 1B:
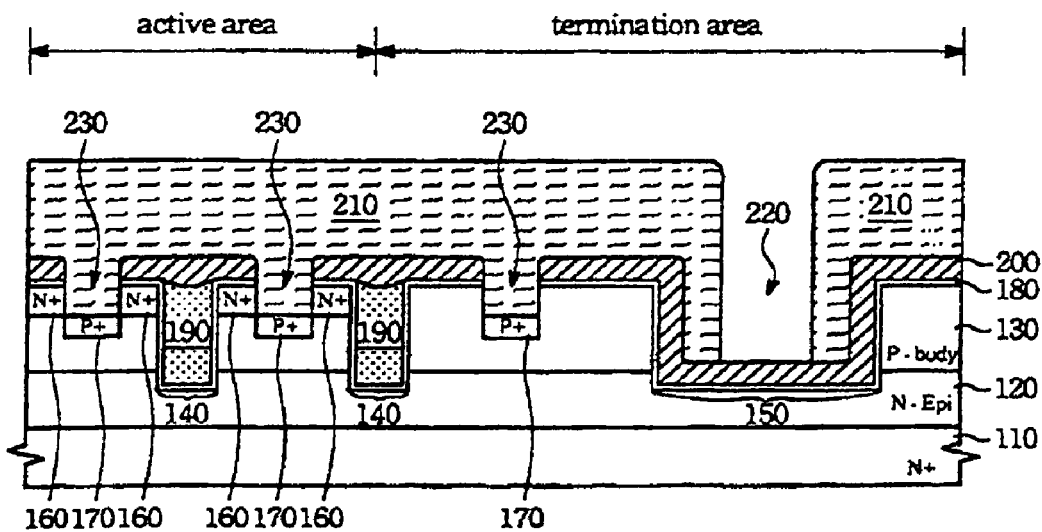
Figure 2A:
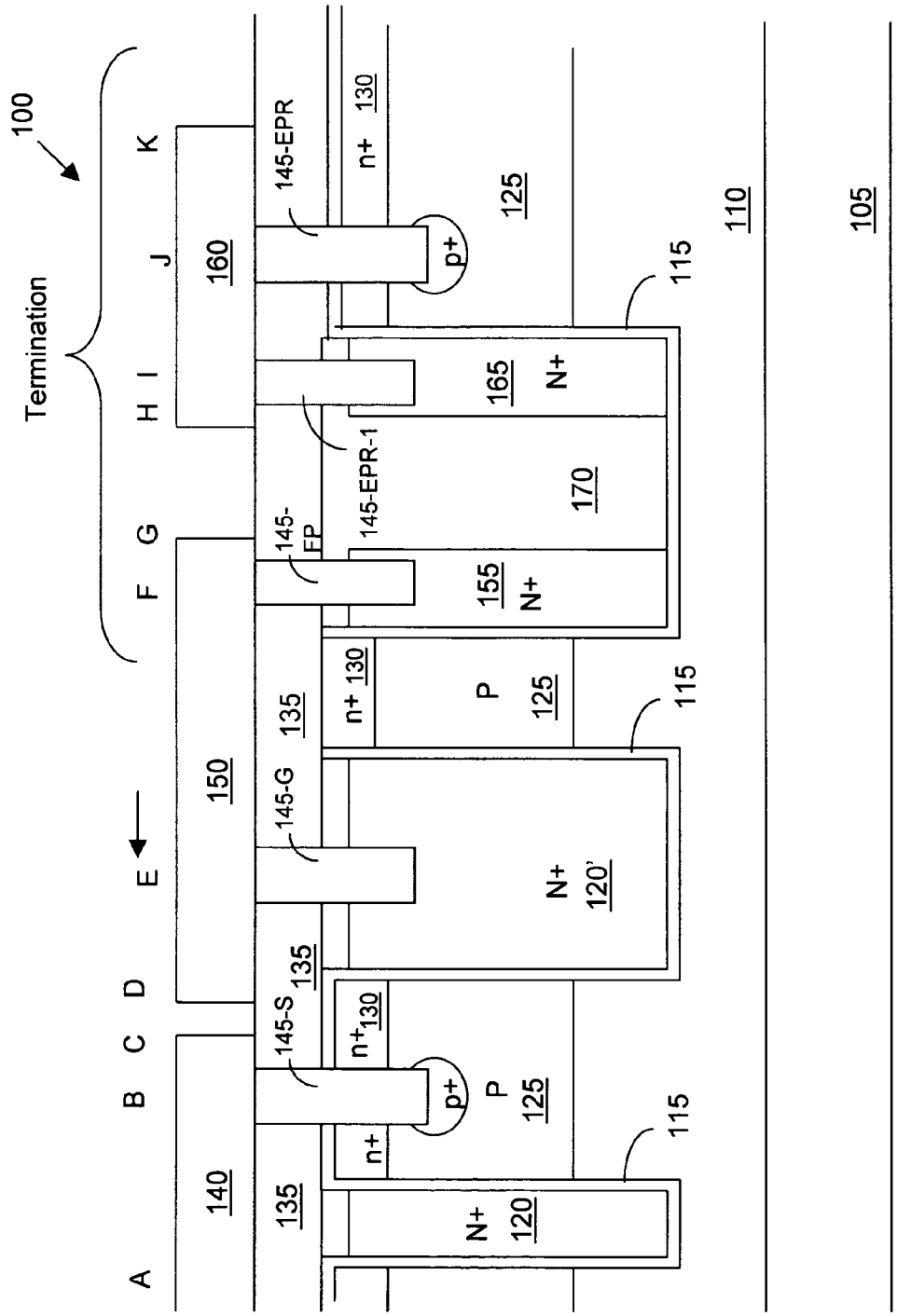
FIGS. 2A and 2B are respectfully a side cross sectional view and top view of a first embodiment for a MOSFET with an improved configuration in the termination area for the present invention.
Figure 2B:
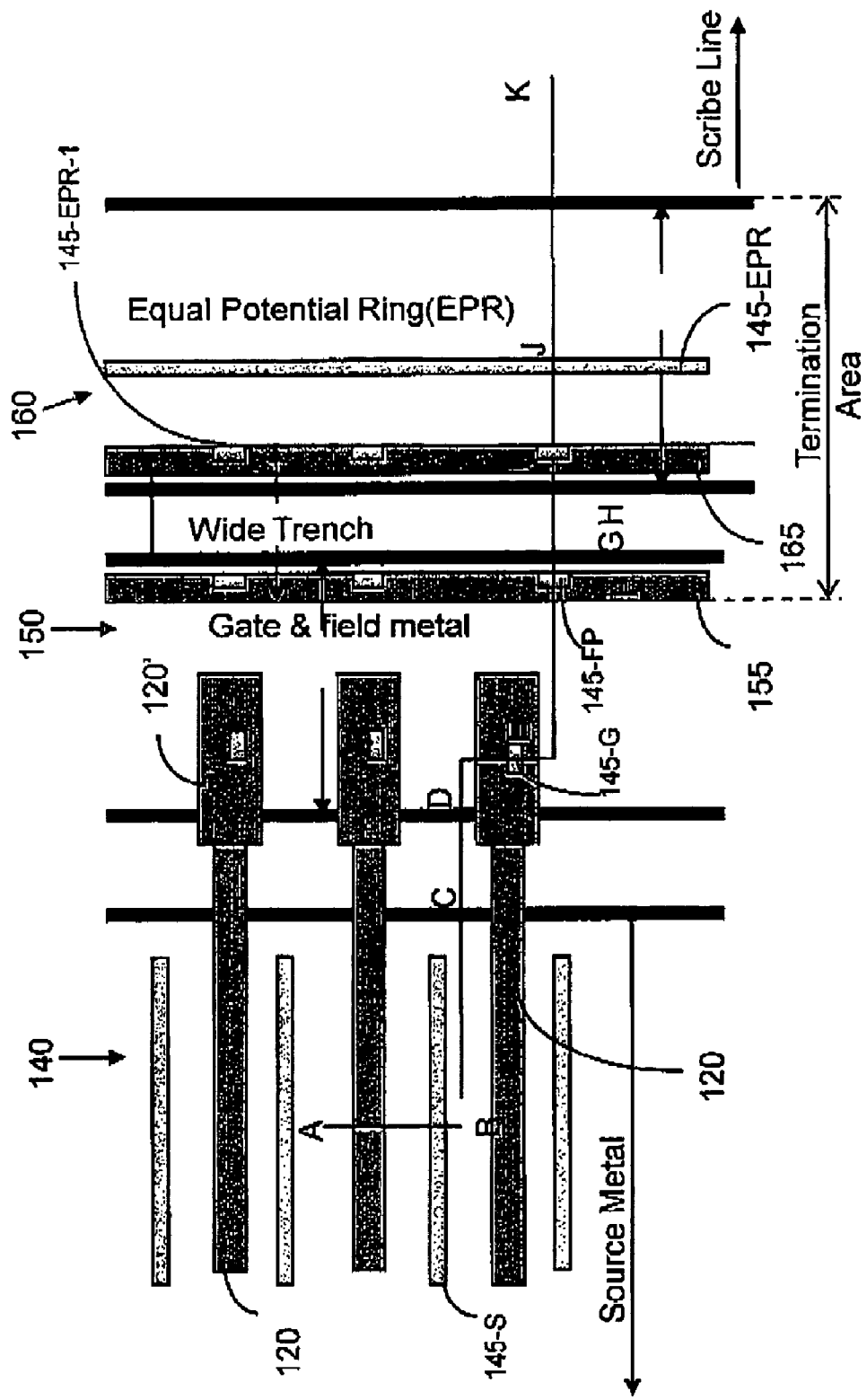

Please refer to FIGS. 2A to 2B for the side cross sectional view and top view of a preferred embodiment of this invention where a metal oxide semiconductor field effect transistor (MOSFET) device 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A source metal layer 140, a gate metal layer 150, and an equal potential ring (EPR) 160 are formed on top of the protective insulation layer 135. This top metal layer, patterned into the source metal 140, the gate metal 150 and the equal potential ring 160, is formed with aluminum, aluminum-cooper, AlCuSi, or Ni/Ag, Al/NiAu, AlCu/NiAu or AlCuSi/NiAu as a wire-bonding layer.

For the purpose of improving the source contact to the source regions 130, a plurality of trenched source contact filled with a tungsten plug 145-S that is surrounded by a barrier layer Ti/TiN. The contact trenches are opened through the NSG and BPSG protective layers 135 to contact the source regions 130 and the P-body 125. Furthermore, there are trenched gate contact filled with tungsten plug 145-G surrounded by a barrier layer Ti/TiN with the gate contact trenches opened through the NSG and BPSG protective layers 135 and extended into the polysilicon 120 of the trenched gate 120.

In order to further increase the active areas for ultra high cell density MOSFET device, a specially configured termination structure is disclosed in the present invention. The termination trenched field plate 155 disposed in a trench. The trenched field plate 155 is in electrical contact with a merged field-plate and gate runner metal 150 through a trenched filed plate contact plug 145-FP. Again, the trenched field-plate contact plug formed by filling the tungsten plug 145-FP surrounded by a barrier layer Ti/TiN in the field-plate contact trenches opened through the NSG and BPSG protective layers 135 and extending into the field plate 155. The trenched filed plate 155 is formed with N+ doped polysilicon. The merged field-pate and gate runner metal 150 thus significantly reduces the area required in the termination area. The semiconductor power device 100 further includes an equal potential ring 160. The EPR 160 is in electrical contact with P+ doped region 125' in the termination area via a trenched EPR contact plug 145-EPR. The EPR 160 is further in electrical contact with a N+ dopeed polysilicon 165 via a plurality of trenched EPR contact plugs 145-EPR-1. The trenched N+ doped polysilicon 165 is disposed in a trench insulated from the trenched field plate 155 by an insulation layer 170. The function of EPR 160 is to ensure the potential around the device edge has same potential after die sawing for uniform breakdown voltage. The die sawing operation is carried out along the scribe line near the EPR 160 before the semiconductor power device is assembled and packaged. In order to assure a uniform breakdown voltage of the device, it is an objective that after the completion of the sawing operation, the N+/P-body/N epi regions are electrically shorted together with an equal potential. However, the sawing process may not short the junction between the N+/P-body/N epi regions uniformly. The EPR 160 will make these regions are electrically shorted over all edges of the device.

Figure 3B:
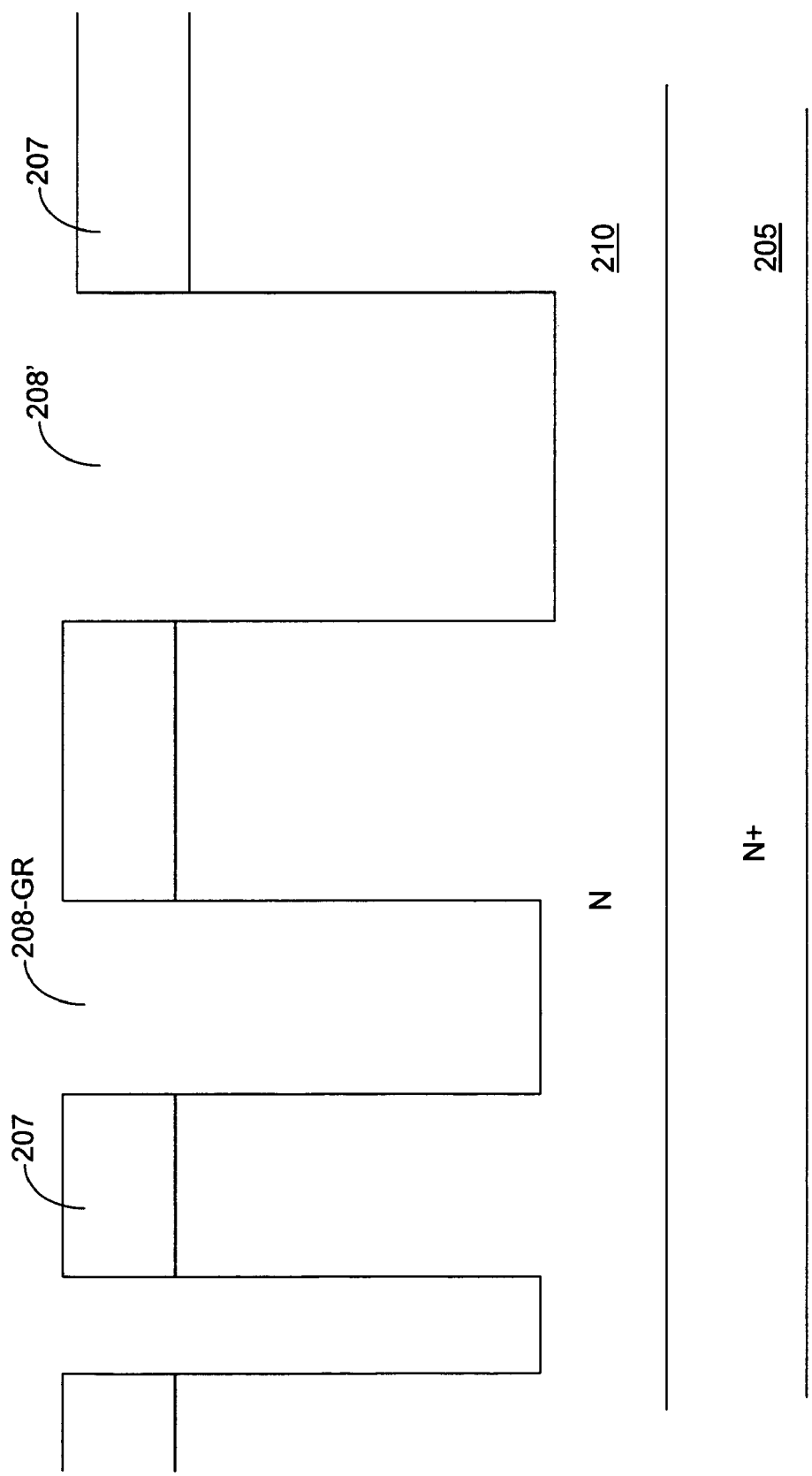
Figure 3C:
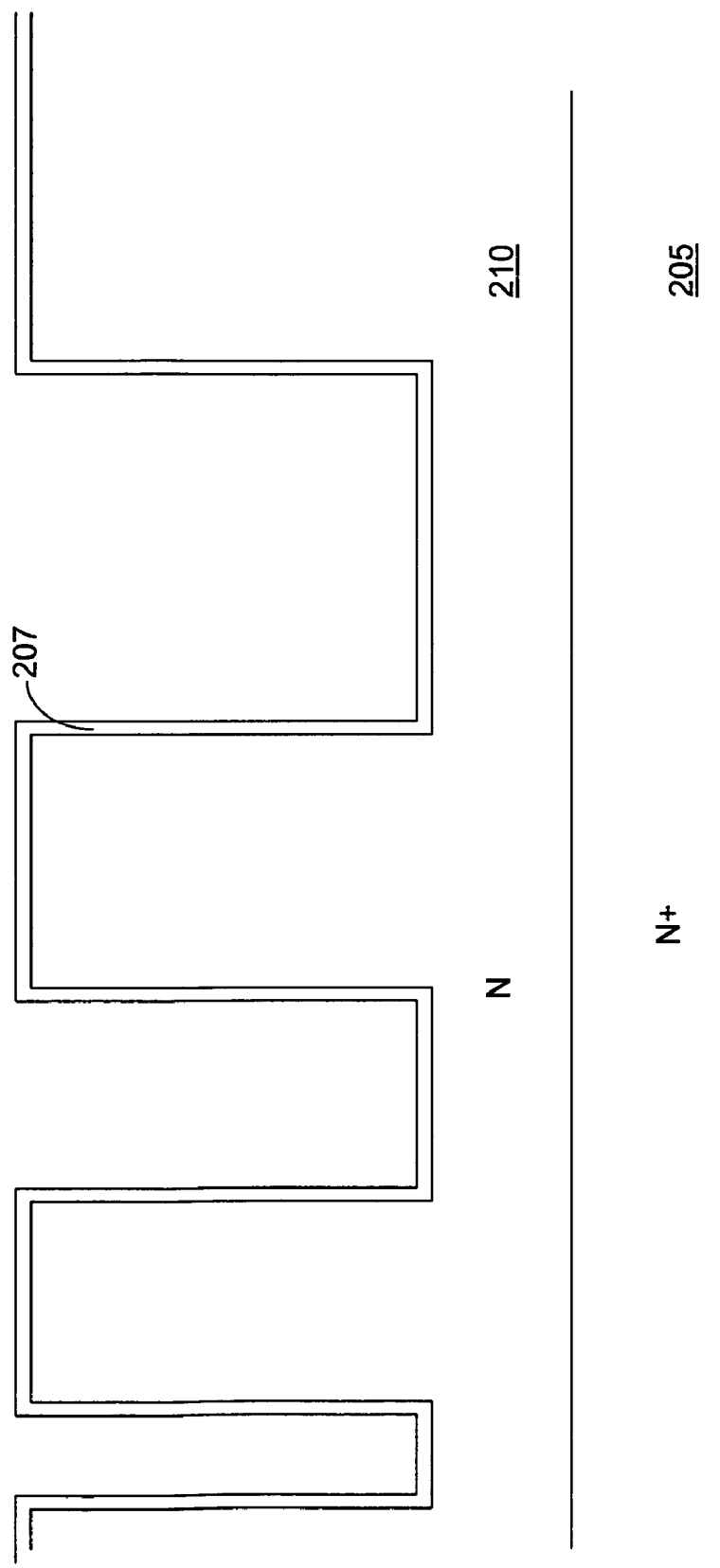
Figure 3D:
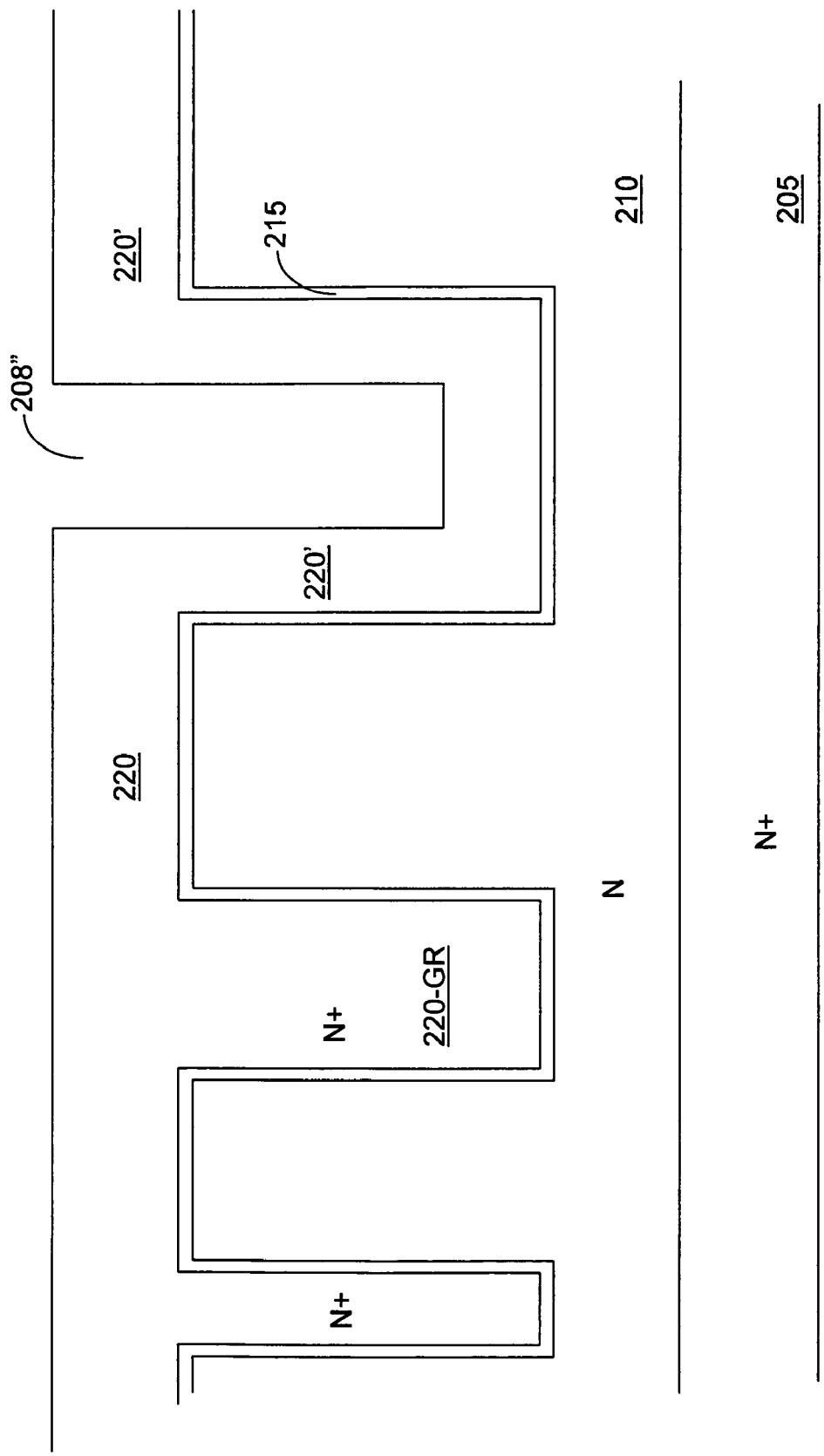
Figure 3E:
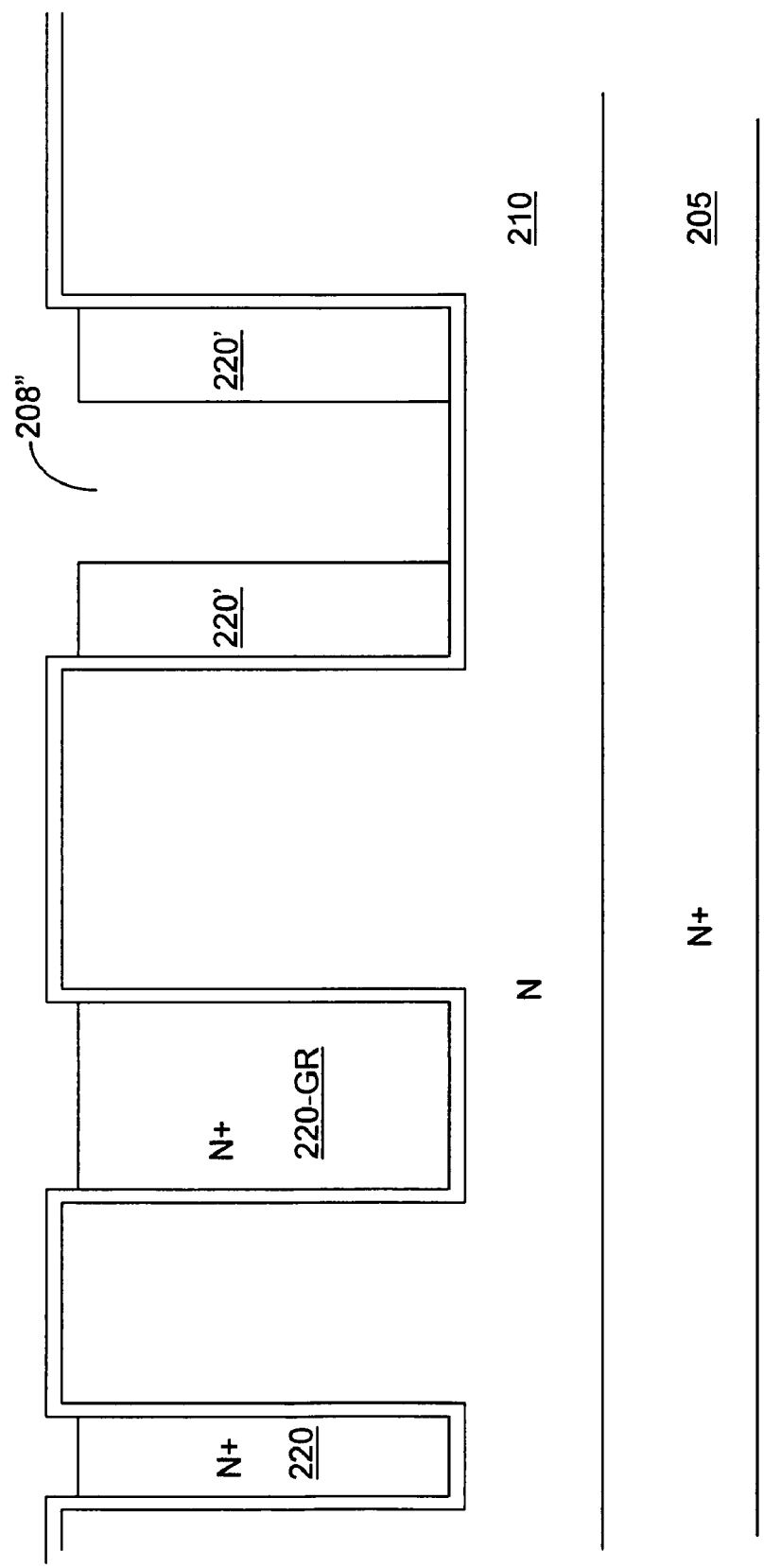

Referring to FIGS. 3A to 3D for a serial of side cross sectional views to illustrate the fabrication steps of a MOSFET device as that shown in FIGS. 2A to 2B. In FIGS. 3A and 3B, a trench mask 207 is applied to open a plurality of trenches 208 in an epitaxial layer 210 supported on a substrate 205 by employing a dry silicon etch process. In the termination area, a wider gate runner trench 208-GR and 208's are also formed. In FIG. 3C, the trench mask 207 is removed and an oxidation process is performed to form an oxide layer covering the trench walls. The trench is oxidized with a sacrificial oxide to remove the plasma damaged silicon layer during the process of opening the trench. Then an oxide layer 215 is grown. In FIG. 3D, the process is followed by depositing a polysilicon layer 220 to fill the trench and covering the top surface and then doped with an N+ dopant. The polysilicon layer 220 filing the trenches 208 in the cell area. The polysilicon layer 220-GR fills the gate runner trenches that extend from the active cell area to the termination area. The polysilicon 220' filling the wider trench 208' has a central hole 208" because the wider trench in the termination area. In FIG. 3E, an anisotropic etch is carried out to etch back the polysilicon layer 220 above the top of the trenches and to remove the polysilicon at the bottom portion of the central hole 208" and form polysilicon sidewall spacer 220' on both sides of the wider trench.

Figure 3F:
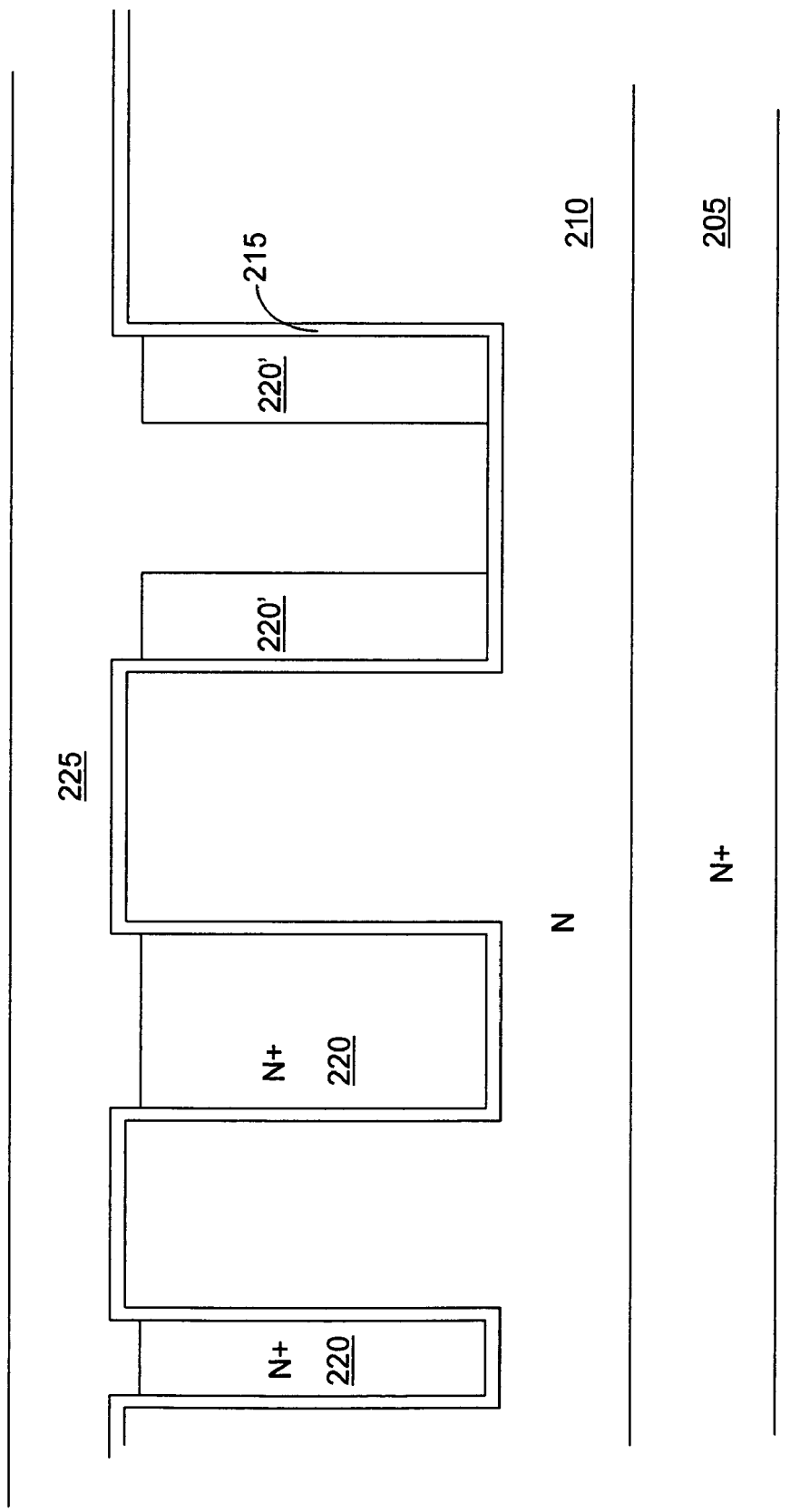
Figure 3G:
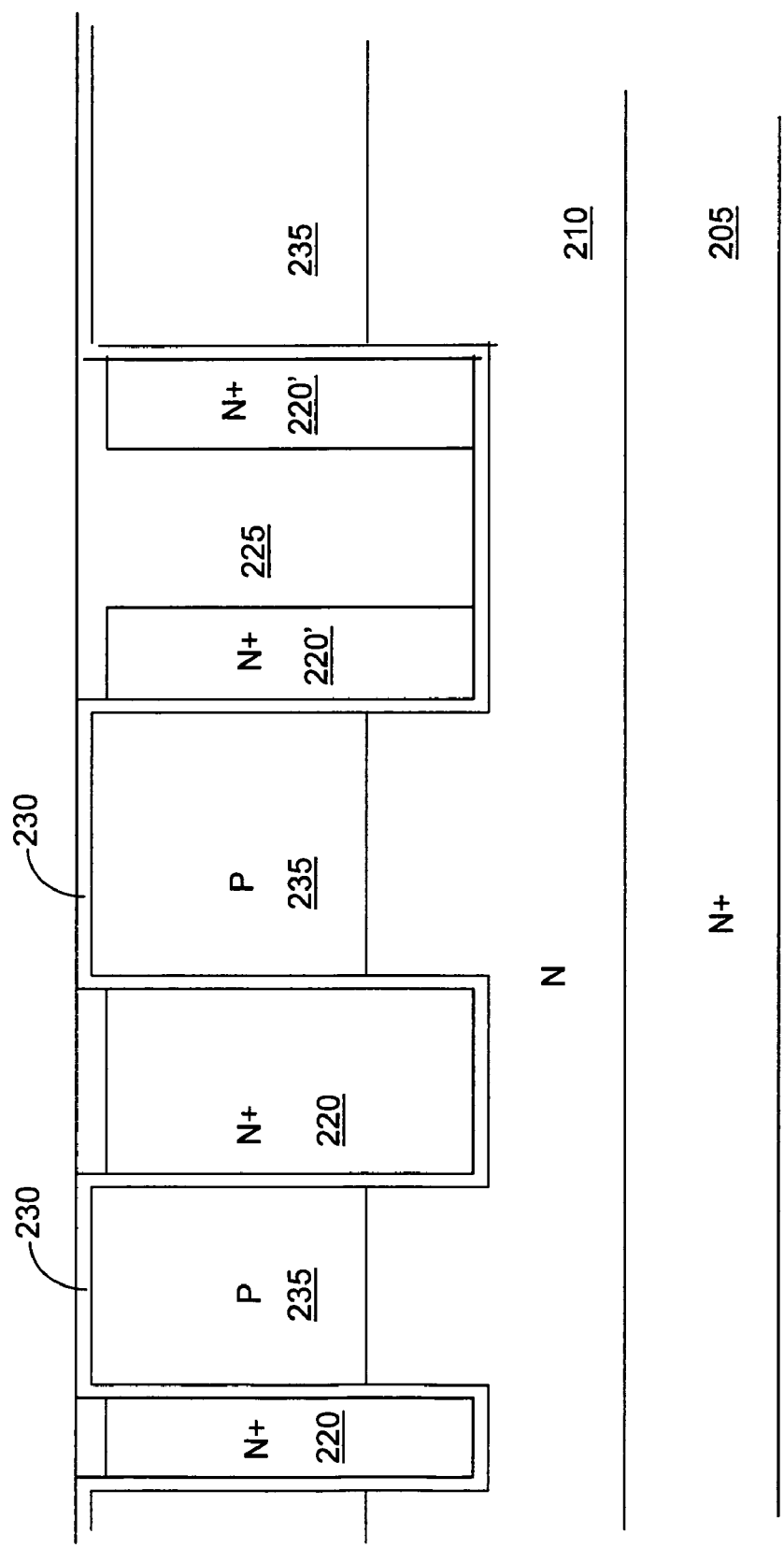
Figure 3H:
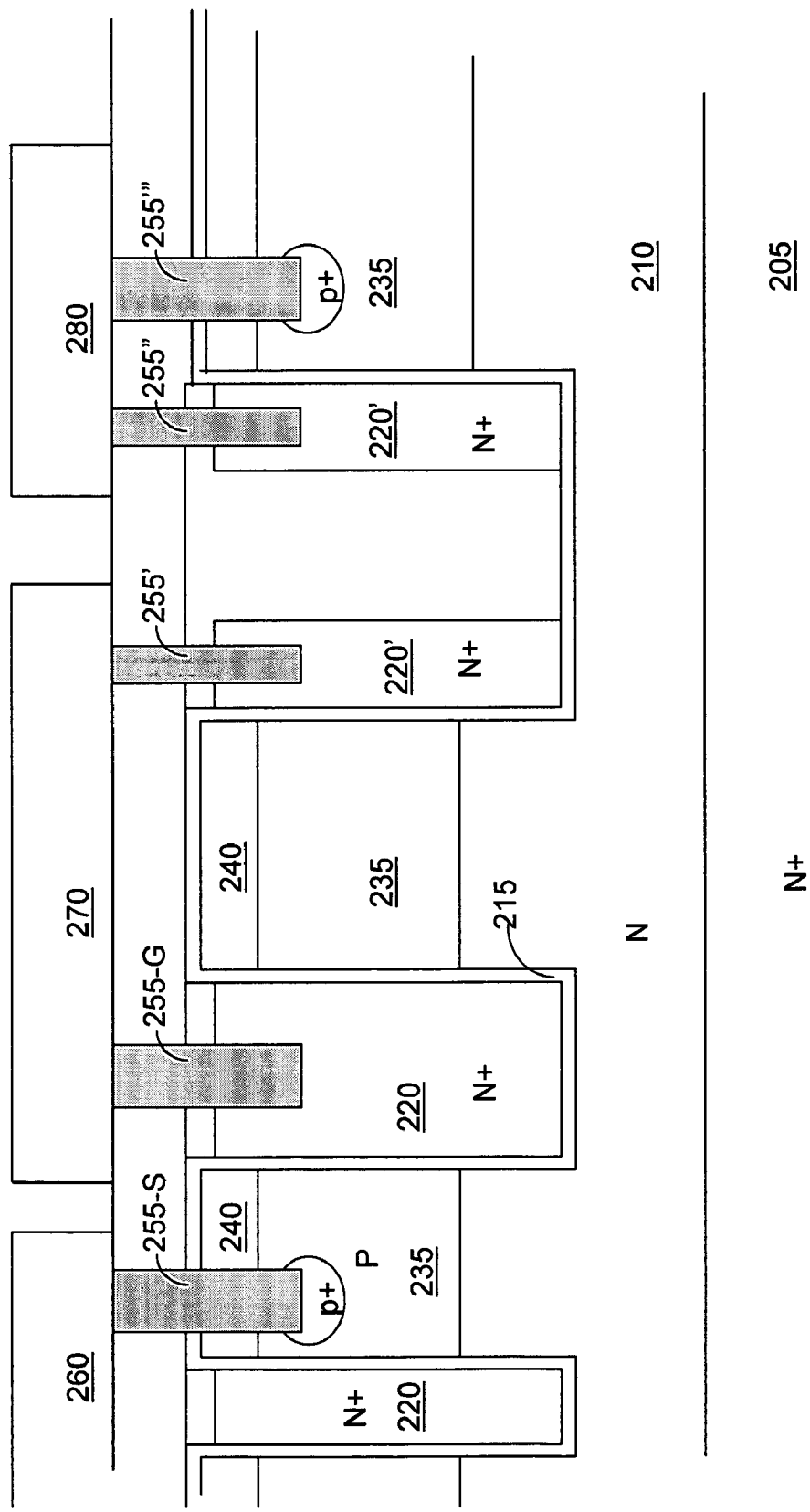

In FIG. 3F, the manufacturing process proceeds with a Tetra-ethyl-ortho-slilicate (TEOS) deposition to form a TEOS oxide layer 225 followed by an anneal process. In FIG. 3G, a dry oxide etch or a chemical mechanical planarization process is carried out followed by a wet oxide etch to remove the top portion of the TEOS oxide layer 225. A screen oxide layer 230 is then grown followed by a P-well ion implant to form the p-body region 235 followed by applying an elevated temperature to carry out a p-body drive in process to diffuse the P-body 235 into the epitaxial layer 210. In FIG. 3H, the processes continues with an N+ source implant into a plurality of source regions 240 followed by a source anneal operation for driving in the source dopant by applying an elevated temperature to form the source regions 240. Then a non-doped oxide (NSG) layer and a BPSG layer 250 are deposited on the top surface followed by applying a contact mask to carry out a contact etch to open the source-body contact trenches 245 by applying an oxide etch through the BPSG and NSG layers 240 followed by a silicon etch to open the contact trenches 255S and 255-G in the active cell areas where the contact openings extend deeper into the source regions 240 and the body regions 235. In the termination area, at least three contact trench 255' and 255" and 255''' are also formed through the same processes. The processes proceed with filling these contact trenches 255-S, 255-G, 255', 255" and 255''' with contact plugs composed of Ti/TiN/W. Optionally, a low resistance conductive layer (not shown) may be formed on top to cover the oxide layer 250 and also to contact the source body contact plugs 245, the gate contact plugs 245' and the field plate plugs 255" and 255''' in the termination area to increase the current conduction areas to reduce the contact resistance. The low resistance metal layer deposited over the top surface may be composed of Ti or Ti/TiN to assure good electric contact is established. Then a top metal conductive layer composed of AlCu is deposited and followed by a metal etch to pattern the metal layer into a source metal pad 260, the gate contact pad 270, and field plate 280 in the termination area. (In the termination area, the field plate 280 is in electrical contact with the trenched gate runner 220' and the p-body region 235 through the trenched gate runner contact plugs 255" and 255'''. For the purpose of enhancing the source-body contact to reducing the on-resistance, a P+ implant is carried out right after the opening of the contact trenches 255-S, 255-G, 255', 255", and 255'''. The P+ dopant contact regions 258 are formed at the bottom of the contact trenches 225-S and 225''' in the p-body dopant regions 235 to enhance the electric conductivity of the source-body contact.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A semiconductor power device comprising a termination area including a trenched gate runner electrically connected to a trenched gate of said semiconductor power device, said semiconductor power device further comprising:
   a trenched field plate disposed in a trench opened in said termination area and said trenched field plate is electrically connected and merged to said trenched gate runner; and
   a gate runner contact trench and a field plate contact trench opened through an insulation layer covering said gate runner and said trenched field plate for extending into a doped gate dielectric filling in said trenched gate runner and said field plate wherein said gate runner contact trench and said field plate contact trench filled with a gate runner contact plug and a field plate contact plug respectively.

2. The semiconductor power device of claim 1 further comprising:
   a gate metal disposed on top of said insulation layer to electrically contact said gate runner contact plug and said field plate contact plug for electrically interconnecting and merging said trenched gate runner and said trenched field plate.

3. A semiconductor power device comprising a termination area including a trenched gate runner electrically connected to a trenched gate of said semiconductor power device, said semiconductor power device further comprising:

a trenched field plate disposed in a trench opened in said termination area and said trenched field plate is electrically connected and merged to said trenched gate runner; and an equal potential ring (EPR) disposed in said termination area wherein said EPR electrically connecting to a body dopant region and a doped dielectric EPR material disposed in a trench.

4. The semiconductor power device of claim 3 further comprising:

a body-dopant region contact trench and an equal potential contact trench opened through an insulation layer covering a top surface above said body-dopant region said doped dielectric EPR material for extending into said body-dopant region and said doped dielectric EPR material wherein said body-dopant region contact trench and said EPR contact trench filled with a body-dopant region contact plug and an EPR contact plug respectively for electrically contacting and interconnected through said EPR.

5. The semiconductor power device of claim 4 wherein:
said body-dopant region contact plug and said EPR contact plug further comprising a tungsten contact plug.

6. The semiconductor power device of claim 4 wherein:
said body-dopant region contact plug and said EPR contact plug further comprising a tungsten contact plug surrounded by a Ti/TiN barrier layer.

7. The semiconductor power device of claim 1 further comprising:

a gate metal disposed on top of said insulation layer to electrically contact said gate runner contact plug and said field plate contact plug for electrically interconnecting said trenched gate runner and said trenched field plate and wherein said gate metal has a width substantially between two to six micrometers.

8. The semiconductor power device of claim 1 wherein:
said trenched field plate and said trenched gate runner are electrically connected by a shortened interconnection whereby said termination area has a length between five to ten micrometers.

9. The semiconductor power device of claim 1 wherein:
said trenched field plate is formed as a polysilicon sidewall spacer in a trench for electrically connecting to said trenched gate runner.

10. The semiconductor power device of claim 1 further comprising:

a source-body contact trench and a gate contact trench opened through an insulation layer covering a top surface of said semiconductor power device extending into a source and a body region of said semiconductor device and also into a doped gate dielectric filling in said trenched gate wherein said source-body contact trench and said gate contact trench are filled with a source-body contact plug and a gate contact plug respectively for shrinking an active cell of said semiconductor power device below a size of 0.6 micrometer.

11. The semiconductor power device of claim 3 further comprising:

a body-dopant region contact trench and an equal potential contact trench opened through an insulation layer covering a top surface above said body-dopant region said doped dielectric EPR material for extending into said body-dopant region and said doped dielectric EPR material wherein said body-dopant region contact trench and said EPR contact trench filled with a body-dopant region contact plug and an EPR contact plug respectively for electrically contacting and interconnected through said EPR; and said trenched field plate is formed as a first polysilicon sidewall spacer in a trench for electrically connecting to said trenched gate runner, and said doped dielectric EPR material is formed as a second polysilicon sidewall space in said trench opposite said trenched field plate to electrically connect to said body-dopant region through said EPR.

12. The semiconductor power device of claim 3 further comprising:

a body-dopant region contact trench and an equal potential contact trench opened through an insulation layer covering a top surface above said body-dopant region said doped dielectric EPR material for extending into said body-dopant region and said doped dielectric EPR material wherein said body-dopant region contact trench and said EPR contact trench filled with a body-dopant region contact plug and an EPR contact plug respectively for electrically contacting and interconnected through said EPR;

a source-body contact trench and a gate contact trench opened through an insulation layer covering a top surface of said semiconductor power device extending into a source and a body region of said semiconductor device and also into a doped gate dielectric filling in said trenched gate wherein said source-body contact trench and said gate contact trench are filled with a source-body contact plug and a gate contact plug respectively; and a contact enhancement body-dopant region disposed below said source-body contact trench and said body-dopant region contact trench in said termination area for enhancing electric connection to said source-body contact plug and said body-dopant region contact plug.

13. The semiconductor power device of claim 1 wherein:
said semiconductor power device comprises a metal oxide semiconductor field effect transistor (MOSFET).

* * * * *